(12) United States Patent
Bertram et al.

(10) Patent No.: US 7,131,083 B2
(45) Date of Patent: Oct. 31, 2006

(54) OPTIMIZATION OF CLOCK NETWORK CAPACITANCE ON AN INTEGRATED CIRCUIT

(75) Inventors: Raymond Bertram, Austin, TX (US); Elizabeth Longwell, Austin, TX (US); Jim Lundberg, Austin, TX (US)

(73) Assignee: IP-First, LLC, Fremont, CA (US)

( * ) Notice: Subject to any disclaimer, the term of this patent is extended or adjusted under 35 U.S.C. 154(b) by 415 days.

(21) Appl. No.: 10/464,782

(22) Filed: May 21, 2003

(65) Prior Publication Data

US 2003/0233623 A1 Dec. 18, 2003

Related U.S. Application Data

(60) Provisional application No. 60/390,055, filed on Jun. 18, 2002.

(51) Int. Cl.
*G06F 17/50* (2006.01)

(52) U.S. Cl. ............... 716/5; 716/10; 716/13

(58) Field of Classification Search ............ None
See application file for complete search history.

(56) References Cited

U.S. PATENT DOCUMENTS

| | | | | |
|---|---|---|---|---|
| 5,109,168 A | * | 4/1992 | Rusu | 326/47 |
| 6,038,383 A | * | 3/2000 | Young et al. | 716/5 |
| 6,301,690 B1 | * | 10/2001 | Ditlow et al. | 716/5 |
| 6,308,303 B1 | * | 10/2001 | Mysore et al. | 716/5 |
| 6,311,313 B1 | * | 10/2001 | Camporese et al. | 716/6 |
| 6,434,731 B1 | | 8/2002 | Brennan et al. | |
| 6,483,364 B1 | | 11/2002 | Choi et al. | |
| 6,675,313 B1 | * | 1/2004 | Cuthbert | 713/503 |
| 2003/0014681 A1 | | 1/2003 | McBride et al. | |

* cited by examiner

*Primary Examiner*—Leigh M. Garbowski
(74) *Attorney, Agent, or Firm*—Gary R. Stanford; Richard K. Huffman; James W. Huffman

(57) ABSTRACT

A method of optimizing clock network capacitance of an integrated circuit (IC) including identifying any crossover points between clock traces and signal traces and reducing clock trace to reference trace capacitance at identified crossover points. Each clock trace is shielded by ground traces routed on either side of the clock traces. The reducing of clock trace to reference trace capacitance may include narrowing the reference traces at identified crossover points. Narrowing of the reference traces at a crossover point reduces capacitance to compensate for additional capacitance between the clock trace and the signal trace. Narrowing may be performed by trimming or notching at the crossover points. Such capacitive compensation provides clock traces of the clock network with substantially uniform capacitance per unit length.

13 Claims, 6 Drawing Sheets

OPTIMIZATION OF CLOCK NETWORK CAPACITANCE ON AN INTEGRATED CIRCUIT

CROSS-REFERENCE TO RELATED APPLICATIONS

This application claims the benefit of U.S. Provisional Application No. 60/390,055 filed on Jun. 18, 2002, which is incorporated herein by reference for all intents and purposes.

BACKGROUND OF THE INVENTION

1. Field of the Invention

The present invention relates to integrated circuit (IC) layout and design, and more particularly to optimization of clock network capacitance on an IC.

2. Description of the Related Art

Present day digital ICs incorporate millions of transistor devices into a very small area. These devices switch and perform functions according to the edges of a core clock signal. The frequencies of core clock signals have recently exceeded the 1 gigahertz (GHz) threshold. At higher clock frequencies, controlling the capacitance of core clock signals becomes more difficult. The conventional technique of controlling capacitance by shielding a clock trace between two ground traces on the same layer as the clock trace becomes increasingly susceptible to capacitive coupling from signal traces unavoidably routed in layers above and below the layer containing the clock trace.

FIG. 1 is a partial top view of an IC 100 portraying the conventional method of controlling capacitance of clock trace. A clock trace 101 routed on a layer 107 was "isolated" from other signals on the same layer 107 by shielding it between two equal width ground traces 103 and 105, where each of the ground traces 103, 105 were routed equidistant from the clock trace 101. For example, the width of each ground trace 103, 105 is "W" and the distance between the signal trace 101 and each ground trace is "D". The capacitance to ground of the clock trace 101 was a function of the width W of the ground traces 103, 105 as well as the distance D of each ground trace 103, 105 from the clock trace 101. By using equal-width ground traces 103, 105 and by placing the ground traces 103, 105 equal distances on either side of the clock trace 101, the clock trace 101 accordingly exhibited a relatively uniform capacitance per unit length for lower clock frequencies, e.g., C1=C2=C3=C4.

At lower clock frequencies, such as those below 1 GHz, the conventional technique was sufficient to control clock signal capacitance. As scaling technologies continued to enable devices to run at higher clock frequencies, however, the capacitance of the clock trace 101 became increasingly influenced by signal traces on layers above and below that have been unavoidably routed over and under the clock trace 101. This influence is illustrated by capacitances C5 and C6 developed between the clock trace 101 and a signal trace 109 routed on another layer 111 and crossing under the clock trace 101 at a crossover point 113. The capacitance to ground seen by the clock trace 101 at the crossover point 113 became greater than the capacitance to ground at other points along the clock trace 101. In particular, the capacitance to ground at the crossover point 113 is C2+C5>C1, and C4+C6>C3. The additional capacitances are problematic at higher clock frequencies because the resistance-capacitance (RC) network characteristics of the clock trace 101 changes significantly at crossover points, such as the crossover point 113, thereby resulting in increased rise times, delays, and local clock signals that are relatively skewed as will now be described.

Turning to FIG. 2, a diagram 200 is presented illustrating how timing problems associated with local clock skews are experienced as a result of non-uniform trace capacitances. The diagram 200 shows two sequential logic blocks, logic block 1 201 and logic block 2 202 that are part of a pipelined data circuit. In such a circuit, data is provided from one logic block 201 to the next 202 in synchronization with local clock signals LCLK1 204 and LCLK2 205 that are supposed to be operating in synchronization. Data is provided from logic block 1 201 to logic block 2 202 over a data bus 203. It is intended that the data bus 203 is valid and should be latched into logic block 2 202 at point A. At point B, data is no longer valid on the data bus 203. For purposes of illustration, signal LCLK2 205 is depicted as delayed, and is thus not operating in relative synchronization with signal LCLK1 204. The skew in LCLK2 205 results from a non-uniform capacitance that is caused by a trace crossover in the vicinity of buffering logic (not shown) for LCLK2 204. Consequently, the rise and fall times of a master clock distribution signal (not shown) are increased to the extent that the buffering logic produces local clock signal LCLK2 205 as a delayed version of LCLK1 204. Hence, signal LCLK2 205 has a latching edge at point C that latches invalid data from the bus 203. FIG. 2 is only one example of the many different forms of timing problems that can arise as a result of clock skewing that is caused by non-uniform capacitances on a distributed clock signal.

Therefore, what is needed is to provide a method and apparatus for providing uniform capacitance per unit length of clock traces for routed circuits and integrated circuits (ICs), including circuits intended to be operated at higher clock frequencies.

SUMMARY OF THE INVENTION

A method of optimizing clock network capacitance of an integrated circuit (IC) according to an embodiment of the present invention includes identifying any crossover points between clock traces and signal traces and reducing clock trace to reference trace capacitance at identified crossover points. Each clock trace is shielded by reference traces routed on either side of the clock traces. The reducing of clock trace to reference trace capacitance may include narrowing the reference traces at identified crossover points, where the reducing includes narrowing the reference traces at identified crossover points, and where the narrowing includes trimming the reference traces, and where the trimming includes notching the reference traces. The method may further include determining per unit length capacitance of a clock trace, determining additional capacitance between the clock trace and the signal trace at an identified crossover point, and determining an amount of narrowing of reference traces at the identified crossover point to compensate for the additional capacitance. A clock network optimizer control file or application program may be employed during IC layout and design.

A method of implementing a circuit on an IC according to an embodiment of the present invention includes routing first and second ground traces on either side of a clock trace on a first layer, locating a crossover point between the clock trace and a signal trace routed on a second layer, and reducing respective widths of the first and second ground traces at the crossover point, where the reducing includes notching at least one side of each of the first and second ground traces. The ground traces may be routed with approximately equal width and be separated from the clock trace by approximately the same distance.

An integrated circuit according to an embodiment of the present invention includes a clock trace on a first layer that is positioned approximately equidistant between first and second reference traces, and a signal trace on second layer that crosses the clock trace. Each of the reference traces have approximately equal widths except that they are narrowed at each location in which the signal trace crosses the clock trace, where the first and second reference traces are each notched where it crosses said clock trace.

A media incorporating program code operative on a circuit layout database according to an embodiment of the present invention includes first program code that identifies crossover points between signal traces and clock traces, second program code that calculates per unit length capacitance between each clock trace having at least one crossover point and corresponding first and second reference traces routed on either side of said each clock trace, third program code that calculates additional capacitance at each crossover point caused by a corresponding signal trace, and fourth program code that calculates width reduction of the corresponding reference traces to compensate for said additional capacitance at each crossover point. The media may further include fifth program code operative to modify the circuit layout database to reduce widths of the reference traces in accordance with the calculated width reductions where the fifth program code programs notches into each reference trace of the corresponding first and second reference traces at each crossover point.

Other features, benefits and advantages of the present invention will become apparent upon study of the remaining portions of the specification and drawings.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventors of the present application has recognized the need to maintain uniform capacitance per unit length along clock signal traces, especially for integrated circuits operative at higher frequencies. They have therefore developed a method for compensating for capacitive variations along clock signal traces, as will be further described below with respect to FIGS. 3–6.

Figure 1:
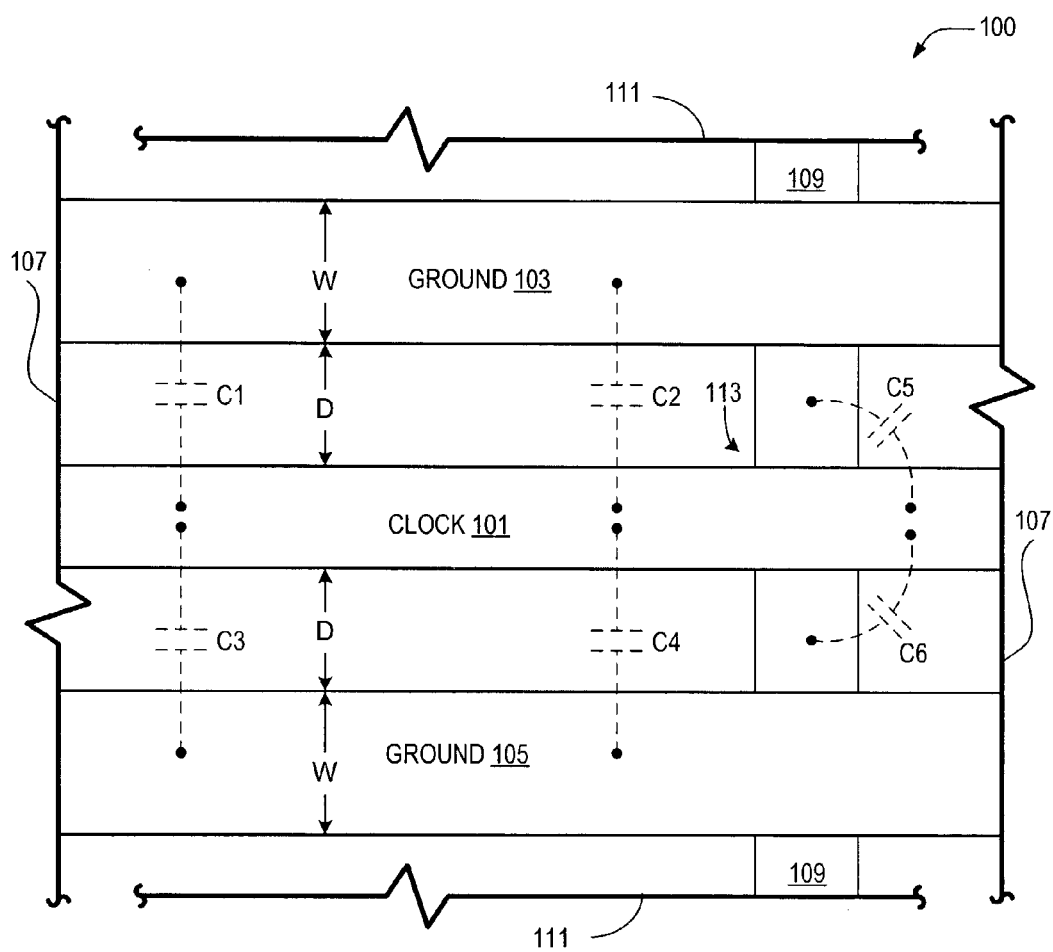
FIG. 1 is a partial top view of an IC portraying the conventional method of controlling capacitance of clock trace.
Figure 3:
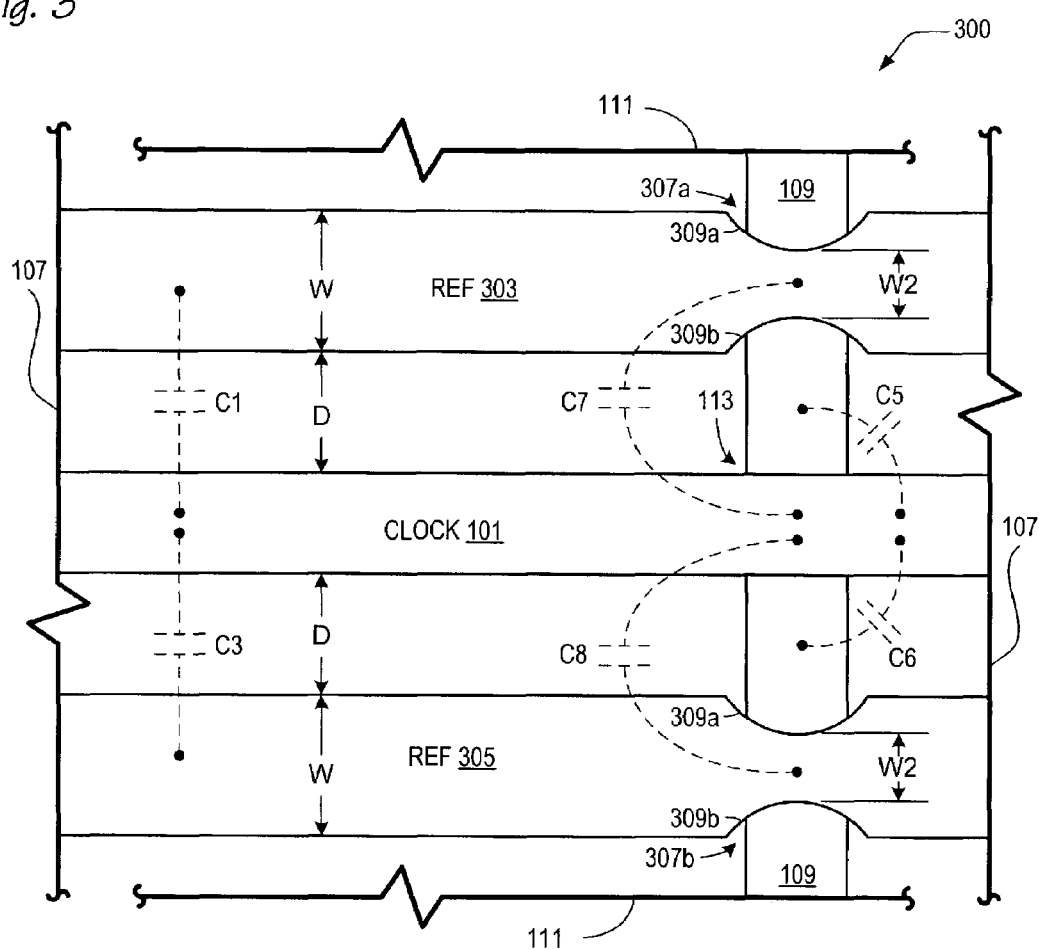
FIG. 3 is a partial top view of an IC illustrating a method according to an embodiment of the present invention for providing a uniform capacitance per unit length of a core clock signal.

FIG. 3 is a partial top view of an IC 300 illustrating a method according to an embodiment of the present invention for providing a uniform capacitance per unit length of a core clock signal. The clock trace 101 is routed on the layer 107 and the signal trace 109 is routed on layer 111 forming the crossover point 113 in substantially the same manner as that shown in FIG. 1. The capacitances C1, C3, C5 and C6 remain substantially unchanged as compared to the IC 100. It is noted that the term "crossover point" generally denotes any location in which a signal trace crosses or intersects a theoretical plane normal to the layers of the IC and collinear with a clock trace, regardless of any particular reference or orientation (e.g., over, under, left, right, etc.). The same signal trace may cross a clock trace at multiple crossover points or several different signal traces may cross a given signal trace at multiple crossover points.

In the embodiment shown, the IC 300 incorporates transistor devices into a relatively small area. The clock trace 101 carries a core clock signal having an exemplary clock frequency, such as, for example, 1 GHz or greater. The present invention, however, contemplates any circuit including printed circuit boards (PCBs) or the like employing any operative clock frequency in which crossover points cause additional capacitance along the length of one or more clock signal traces. The layers 107 and 111 are generally parallel with each other and may be adjacent to each other, although the present invention contemplates any number of intermediate layers (one or more) in which additional capacitance exists that changes the per unit length capacitance along a given clock trace.

Reference traces 303 and 305 are shown routed on either side of the signal trace 101 in a similar manner as the ground traces 103 and 105, respectively. A "reference trace" carries any suitable reference voltage level and includes ground traces. The reference traces 303, 305 are each shown having the same width W and are routed at approximately the same distance D from the signal trace 101 as the ground traces 103 and 105 of FIG. 1, resulting in generally the same uniform capacitance per unit length C1 and C3, where C1=C3. The crossover point 113 generally creates a crossover location including two additional crossover points 307a and 307b, where the signal trace 109 crosses the corresponding reference traces 303 and 305, respectively. The reference traces 303 and 305 are narrowed at the respective crossover points 307a and 307b to a new width "W2". In the configuration shown, the reference traces 303 and 305 are notched using arcuate or arc-shaped notches 309a and 309b symmetrically located on either side of the reference traces 303 and 305 to achieve the new width W2 at each of the crossover points 307a and 307b.

The notches 309a and 309b are provided to narrow the width of the reference traces 303 and 305, respectively, thereby reducing the capacitances C2 and C4 at the respective crossover points 307a and 307b to new capacitances C7 and C8, respectively. In particular, the reduced capacitance C7 is selected to compensate for the additional capacitance C5 to maintain the per unit length capacitance to C1, so that C7+C5=C1. In a similar manner, the reduced capacitance C8 is selected to compensate for the additional capacitance C6 to maintain the per unit length capacitance to C3, so that C8+C6=C3. In sum, at the crossover points 307a and 307b associated with the crossover point 113, the isolation reference traces 303, 305 are notched to decrease the clock-to-reference capacitances (e.g., reduce C2 to C7 and reduce C4 to C8) to compensate for the clock-to-adjacent signal trace capacitances (e.g., C5 and C6) so that the capacitance of the clock trace 101 at the crossover point 113 substantially equals a desired uniform capacitance per unit length of the clock network.

Symmetrically-opposed and symmetrically-shaped arcuate notches provide a simple and easily implemented solution to achieve the narrowing of conductive traces for capacitive compensation. Several variations are nonetheless contemplated. Trimming of traces may have any shape or form sufficient to achieve the desired capacitance reduction while maintaining electrical and mechanical integrity. Square-shaped notches may be used, but have sharper angles which could cause undesirable results. Arc-shaped notches tend to naturally avoid sharp angles. The corners and edges of square-shaped notches, however, may be rounded. A single notch on one side of the conductive trace is contemplated to achieve the desired reduction in trace width, although a pair of notches on opposite sides allows for smaller notches. A single arc-shaped notch on one side may have to be made longer than desired to achieve the desired width reduction. A smaller arc radius could be used to reduce the arc length, but may tend to create sharper edges along the trace edge.

Figure 4:
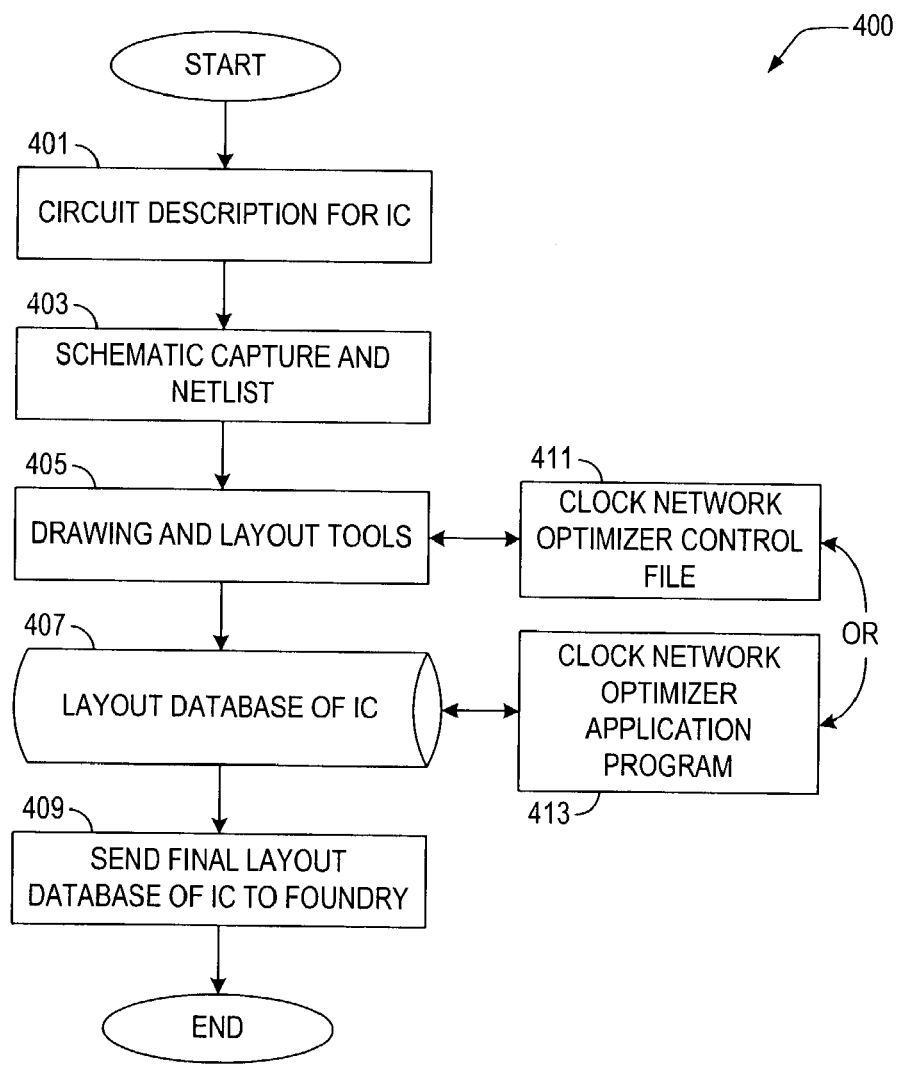
FIG. 4 is a flowchart diagram illustrating an exemplary procedure used for IC design incorporating optimization of clock network capacitance in accordance with the present invention.

FIG. 4 is a flowchart diagram illustrating an exemplary procedure 400 used for IC design incorporating optimization of clock network capacitance in accordance with the present invention. As illustrated at a first block 401, design engineers generate a circuit description for an IC. The circuit description may be provided in any one of many formats known to those skilled in the art, such as any suitable Hardware Description Language (HDL). Examples of HDL include Register Transfer Level (RTL), Verilog HDL, etc. The RTL or HDL code files are processed by a suitable schematic capture and net list program as shown at next block 403, such as, for example, the schematic capture and net list tools provided by Mentor Graphics. The schematic capture and net list program generates a database that describes the components of the circuit and a net list that describes component interconnections. The schematic capture and net list database may be in any suitable format, such as ASCII (American Standard Code for Information Interchange) or the like.

The schematic capture and net list database is provided to drawing and layout tools as shown at next block 405 to layout the chip. An example of drawing and layout tools is the Virtuoso® family of tools provided by Cadence Design Systems, Inc. (Cadence). Effectively, the drawing tool incorporates the polygon shapes needed for the entire design including accumulated mask layers, transistors, conductive interconnects and vias between layers. An auto layout tool or the like is used to lay out the interconnections, such as the Cadence Custom Chip Assembly Router. The drawing and layout tools provide a layout database output file, also known as a "tape out", as shown at block 407. The layout database file may conform to an industry standard format, such as GDSII or the like. The GDSII file format is also known as "Calma Stream" format and was originally developed by the Calma division of General Electric Corporation. Rights to this format are now owned by Cadence Design Systems. Additional processing may be employed, such as design rule checking applications that determine whether the layout database file conforms to design runs provided by a foundry for fabrication. The layout database file may be "tweaked" or otherwise modified to ensure conformance to applied design rules. At next block 409, the final layout database file is sent to a foundry for development of a confirmation mask, which ultimately leads to a fabricated chip.

A clock network optimizer function in accordance with an embodiment of the present invention is performed during the IC circuit design procedure. In one embodiment, the clock network optimizer function is implemented as a control file 411, which is used by the design and layout tools to interpret selected shapes or all shapes. The control file 411 incorporates program code that informs the design and layout tools how to apply special functionality, such as, in the present case, how to narrow, trim or otherwise notch reference traces at identified crossover points. The control file 411 includes program code that identifies clock trace crossover points and program code that determines appropriate parameters to narrow the corresponding reference traces associated with each crossover point to substantially maintain uniform capacitance along the clock trace.

In an alternative embodiment, the clock network optimizer function is implemented as an application program 413 or the like, which modifies a completed layout database file to identify crossover points and to narrow the corresponding reference traces to substantially maintain uniform capacitance along each clock trace. The layout database file is modified accordingly before being sent to the foundry.

Figure 5:
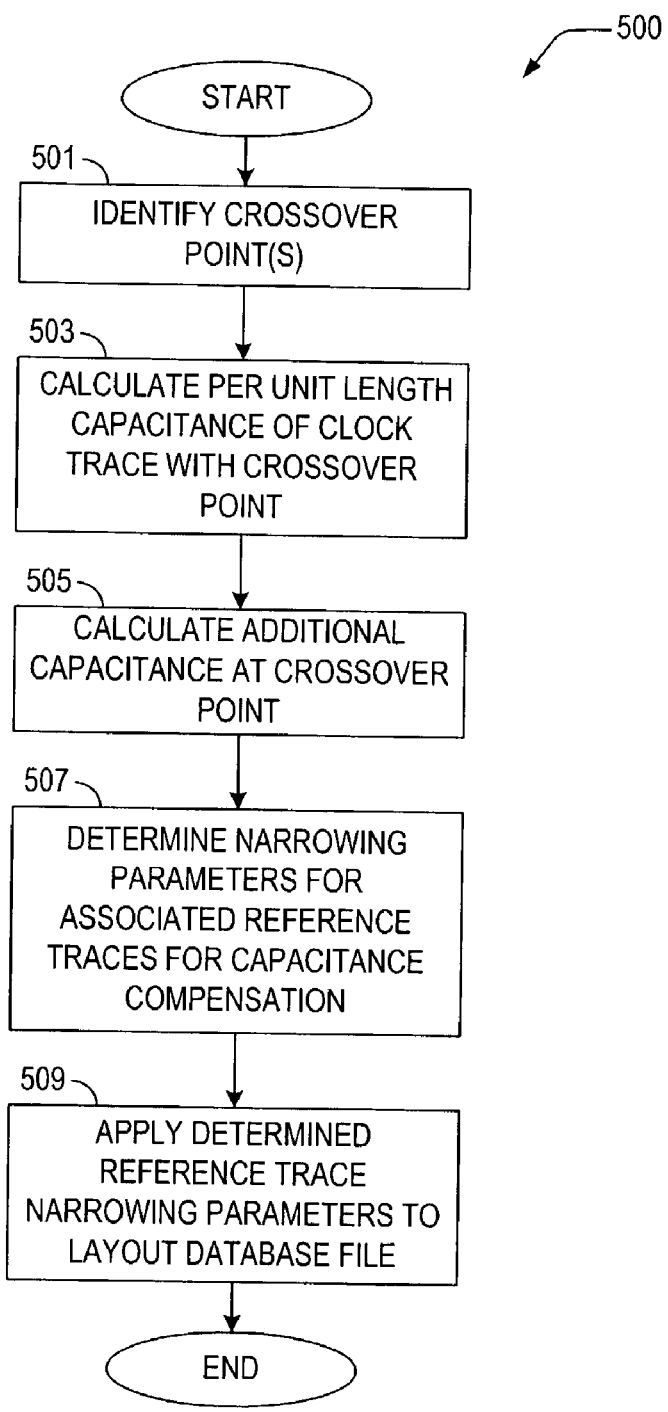
FIG. 5 is a flowchart diagram illustrating the general functionality of clock network optimizer program code provide within the control file or the application program of FIG. 4.

FIG. 5 is a flowchart diagram 500 illustrating the general functionality of the program code of the clock network optimizer control file 411 or the clock network optimizer application program 413. The program code may be implemented on any suitable media, such as, for example, magnetic media (tape, disk drive, floppy, etc.), optical media (CD-ROM, optical disk drives, etc.), electronic media (RAM, ROM, etc.), etc., or any other media now known or subsequently invented. At a first block 501, one or more of the crossover points of the circuit are located or otherwise identified. At next block 503, the per unit length capacitance of a clock trace having at least one crossover point is calculated (e.g., C1 and C3). At next block 505, any additional capacitance at the crossover point is calculated (e.g., C5 and C6). At next block 507, the narrowing parameters for reference traces associated with the crossover point to achieve capacitance compensation are determined. The parameters may include, for example, identification of the reference traces, crossover points along the reference traces, and parameters necessary to implement the desired narrowing, trimming, notching, etc. At final block 509, the narrowing parameters are applied to the layout database to achieve capacitive compensation. The blocks 501–509 may be performed one crossover point at a time or each may be performed for each identified crossover point in the layout database.

Figure 2:
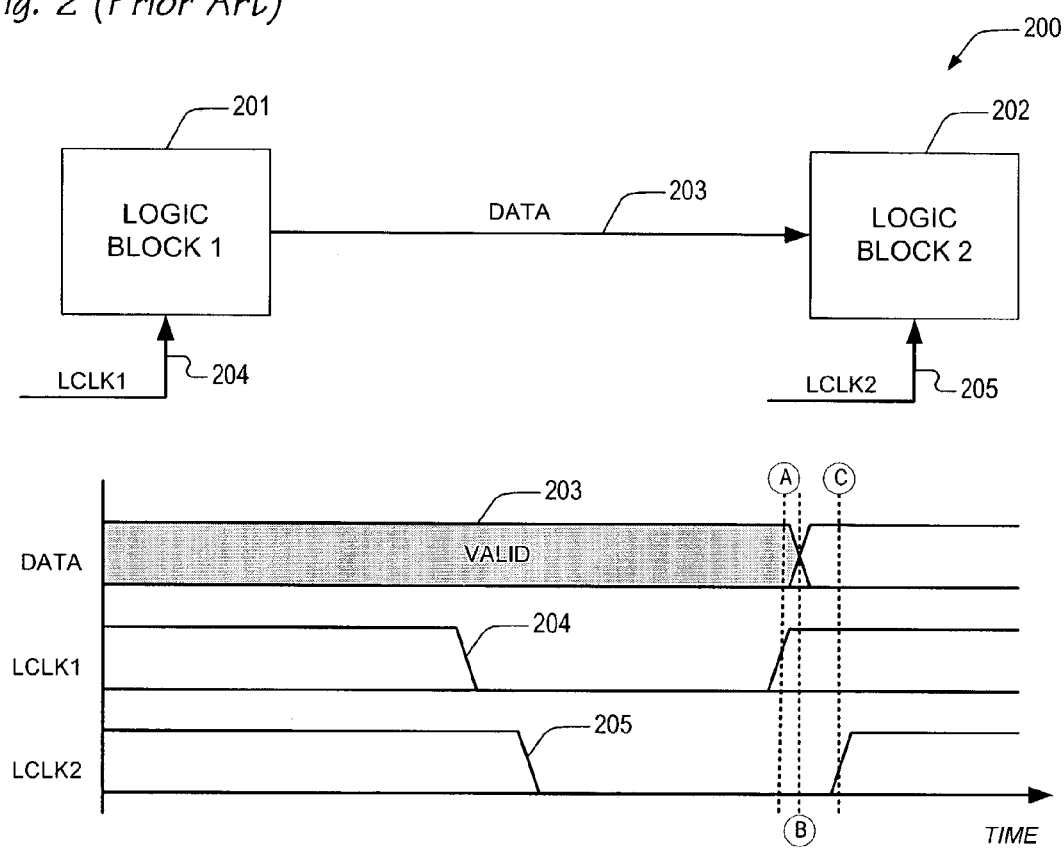
FIG. 2 is a diagram illustrating how timing problems in a pipelined system result from non-uniform clock capacitance.
Figure 6:
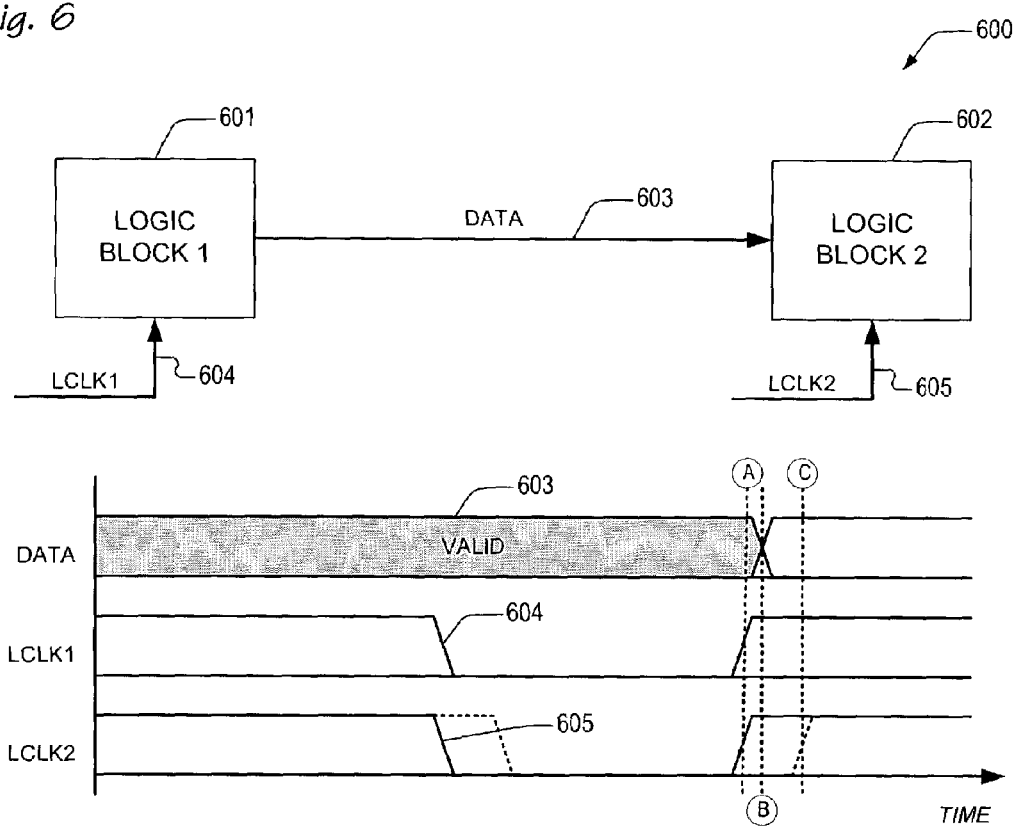
FIG. 6 is a diagram depicting proper timing in a pipelined system according to the present invention.

Now turning to FIG. 6, a diagram 600 is presented illustrating how timing problems associated with local clock skews are eliminated by notching reference signal traces according to the present invention at crossover points. The diagram 600 shows two sequential logic blocks, logic block 1 601 and logic block 2 602 that are part of a pipelined data circuit. And like the example discussed above with reference to FIG. 2, data is provided from one logic block 601 to the next 602 in synchronization with a local clock signals LCLK1 604 and LCLK2 605 that are supposed to be operating in synchronization. Data is provided from logic block 1 601 to logic block 2 602 over a data bus 603. It is intended that the data bus 603 is valid and should be latched into logic block 2 602 at point A. At point B, data is no longer valid on the data bus 603. For purposes of illustration, signal LCLK2 605 is depicted as accelerating as a result of applying trace notching at crossover points in accordance with the present invention, thus providing a rising edge for latching data at point A as opposed to point C, where a rising edge for a non-compensated local clock trace would otherwise occur, as is depicted by dashed lines. As a result of applying the present invention to a clock distribution signal (not shown) in the vicinity of buffer circuitry (not shown) for signal LCLK2 605, it is thus operating synchronization with signal LCLK1 604. Hence, the rising edge of LCLK2 605 latches valid data prior to it being removed from the bus 603 at point B. FIG. 6 illustrates only one example of the many different embodiments of the present invention that can be employed to detect and correct timing problems in an integrated circuit that result from non-uniform clock capacitance.

Several benefits and advantages are realized when employing optimization of clock network capacitance in accordance with embodiments of the present invention. The amount of between clock and reference traces at crossover points is modified to compensate for signal trace additional capacitance to provide clock signal traces with uniform capacitance per unit length. At higher core clock frequencies, the RC network characteristics of the clock traces do not significantly change at the modified crossover points so that rise times and delays are not increased. The core clock signal, therefore, exhibits more uniform capacitance per unit length at higher clock frequencies enabling a concomitant increase in clock speed. Additionally, designers are allowed more freedom to route signals across clock lines since otherwise negative capacitive effects are eliminated or otherwise controlled.

Although the present invention has been described in considerable detail with reference to certain preferred versions thereof, other versions and variations are possible and contemplated. For example, the present invention applies to manual modifications made by circuit designers as well as automatic or computer software embodiments, including control files, application programs, etc. Moreover, many variations are contemplated to narrow reference traces to achieve capacitance compensation, such as the types and sizes of notches or simple trimming of the conductive traces. Although the present disclosure contemplates capacitance compensation of clock traces, it may also be applied to any high frequency signal trace that is shielded by reference traces (other than clock traces) in which it is desired to maintain uniform capacitance along the signal trace.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. A method of optimizing clock network capacitance of an integrated circuit (IC), comprising:
   identifying any crossover points between clock traces and signal traces, each clock trace shielded by reference traces routed on either side of the clock traces; and
   reducing clock trace to reference trace capacitance at identified crossover points, wherein said reducing comprises narrowing the reference traces at identified crossover points, and wherein said narrowing comprises trimming the reference traces, and wherein said trimming comprises notching the reference traces.

2. The method of claim 1, further comprising:
   determining per unit length capacitance of a clock trace having an identified crossover point with a signal trace;
   determining additional capacitance between the clock trace and the signal trace at the identified crossover point;
   determining an amount of narrowing of reference traces at the identified crossover point to compensate for the additional capacitance; and
   narrowing the reference traces at the identified crossover point.

3. The method of claim 2, further comprising:
   receiving, by an application program, a layout database of the IC, wherein
   the application program performing said identifying any crossover points, and further calculating per unit length capacitance of a clock trace having an identified crossover point, calculating additional capacitance between the clock trace and the signal trace, and calculating an amount of narrowing of the reference traces; and
   the application program modifying the layout database to perform said narrowing of the reference traces.

4. The method of claim 2, further comprising:
   executing a layout tool to generate a layout database of the IC;
   employing, by the layout tool, a control file that optimizes clock network capacitance of the IC during layout;
   the control file performing said identifying any crossover points, and further calculating per unit length capacitance of a clock trace having an identified crossover point, calculating additional capacitance between the clock trace and the signal trace, and calculating an amount of narrowing of the reference traces; and
   the control file cooperating with the layout tool to perform said narrowing of the reference traces.

5. A method of implementing a circuit on an IC, comprising:
   routing first and second ground traces on either side of a clock trace on a first layer;
   locating a crossover point between the clock trace and a signal trace routed on a second layer; and
   reducing respective widths of the first and second ground traces at the crossover point wherein said reducing comprises notching at least one side of each of the first and second ground traces.

6. The method of claim 5, wherein said routing comprises routing the first and second ground traces with approximately equal width and separated from the clock trace by approximately the same distance.

7. The method of claim 5, further comprising:
   generating a layout database of the circuit;
   executing code operative on the layout database; and
   the code locating the crossover point and modifying the layout database to reduce the respective widths of first and second ground traces at the crossover point.

8. The method of claim 7, wherein said executing code comprises executing a drawing and layout tool that employs a clock network optimizer control file.

9. The method of claim 7, wherein said executing code comprises executing a clock network optimizer application program operative to modify a completed layout database.

10. The method of claim 5, further comprising:
determining a per unit length capacitance along the clock trace;
determining additional capacitance between the clock trace and the signal trace at the crossover point; and
determining a width reduction of the first and second ground traces at the crossover point that compensates for the additional capacitance.

11. An integrated circuit, comprising:
a clock trace on a first layer and positioned approximately equidistant between first and second reference traces;
a signal trace on second layer that crosses said clock trace; and
said first and second reference traces each having approximately equal widths except being narrowed at each location in which said signal trace crosses said clock trace, wherein said first and second reference traces are each notched where it crosses said clock trace.

12. The integrated circuit of claim 11, wherein said clock trace exhibits a substantially uniform capacitance per unit length.

13. A media incorporating program code operative on a circuit layout database, said program code comprising:
first program code that identifies crossover points between signal traces and clock traces;
second program code that calculates per unit length capacitance between each clock trace having at least one crossover point and corresponding first and second reference traces routed on either side of said each clock trace;
third program code that calculates additional capacitance at each crossover point caused by a corresponding signal trace; and
fourth program code that calculates width reduction of said corresponding first and second reference traces to compensate for said additional capacitance at each said crossover point; and
fifth program code operative to modify the circuit layout database to reduce widths of each of the corresponding first and second reference traces in accordance with corresponding calculated width reductions, wherein said fifth program code programs notches into each reference trace of said corresponding first and second reference traces at each said crossover point.

\* \* \* \* \*